United States Patent [19]
Ameen et al.

[11] Patent Number: 5,350,487
[45] Date of Patent: Sep. 27, 1994

[54] METHOD OF ETCHING POLYIMIDE

[76] Inventors: Thomas J. Ameen, 6818 Glencairn Ct., Mentor, Ohio 44060; John A. Payak, 30050 Euclid Ave., G-8, Wickliffe, Ohio 44092; Jerome M. Cangelosi, 7817 Richwood Dr., Mentor-on-the Lake, Ohio 44060

[21] Appl. No.: 57,005
[22] Filed: May 3, 1993
[51] Int. Cl.$^5$ .................. B44C 1/22; B29C 37/00
[52] U.S. Cl. ..................... 156/642; 156/637; 156/639; 156/668; 252/79.5
[58] Field of Search ............... 156/637, 639, 642, 655, 156/659.1, 668; 134/26, 29, 34; 252/79.5

[56] References Cited
U.S. PATENT DOCUMENTS

| | | | |
|---|---|---|---|
| 3,400,027 | 9/1968 | Radimer et al. | 156/19 |
| 3,791,848 | 2/1974 | De Angelo | 117/47 |
| 3,833,436 | 9/1974 | Hillis et al. | 156/13 |
| 4,426,253 | 1/1984 | Kreuz et al. | 156/668 |
| 4,428,796 | 1/1984 | Milgram | 156/637 |
| 4,563,242 | 1/1986 | Shigemitsu | 156/651 |
| 4,647,345 | 3/1987 | Polan | 204/13 |
| 4,846,929 | 7/1989 | Bard et al. | 156/630 |
| 4,857,143 | 8/1989 | Glenning et al. | 156/668 |
| 4,878,991 | 11/1989 | Eichelberger et al. | 156/630 |
| 4,911,786 | 3/1990 | Kindl et al. | 156/659 |
| 4,959,121 | 9/1990 | Dumas et al. | 156/668 |
| 4,960,491 | 10/1990 | Youlton | 156/668 |
| 4,976,808 | 12/1990 | Ogasawara | 156/668 X |

*Primary Examiner*—William Powell
*Attorney, Agent, or Firm*—Benesch, Friedlander, Coplan & Aronoff

[57] ABSTRACT

The present invention relates to methods of etching polyimide from a substrate and to the etched substrates prepared according to such methods. In one embodiment, the present invention provides a method of etching polyimide from a substrate, comprising the steps of: providing a basic bath; ultrasonically agitating said basic bath; exposing said substrate containing polyimide to said basic bath; rinsing said substrate with hot water; optionally repeating the aforementioned steps at least once; and recovering an etched substrate. In another embodiment, the present invention provides a method of etching polyimide from a substrate, comprising the steps of: providing a basic bath; exposing said substrate containing polyimide to said basic bath; rinsing said substrate with hot water; maintaining the high loading capacity of said basic bath after exposure of polyimide to said basic bath, comprising cooling at least a portion of said basic bath thereby precipitating particles and separating the particles from said basic bath prior to reuse of said basic bath; and recovering an etched substrate.

15 Claims, 1 Drawing Sheet

METHOD OF ETCHING POLYIMIDE

BACKGROUND OF THE INVENTION

1) Field of the Invention

The present invention relates to methods of etching polyimide from a substrate and to the etched substrates prepared according to such methods. The methods of etching polyimide from a substrate and the resulting etched substrates are useful in the formation of hybrid circuits, printed circuit boards and tape automatic bonding structures.

2) State of the Art

Polyimides are polymers characterized by low dielectric constants and high temperature stability. Because of these and other characteristics, polyimides are frequently used in the electronics industry today. In particular, polyimides have found utility in printed circuit board technology. For instance, polyimides may be employed as a dielectric support in the manufacture of printed circuit boards.

Etching treatments for polyimides are well known. The etching treatments are important because, among other things, they are necessary for the formation of hybrid circuits, integrated circuits, tape automated bonding structures and the like. Nevertheless, there are difficulties associated with the present methods of etching polyimides.

One method employs the addition of solvents to etch polyimide from a substrate. However, conventional photoresists, which may be present in a substrate, may not always be strong enough to resist the polyimide etchant. In other words, the addition of solvents may also remove conventional photoresists and/or degrade the adhesion properties of conventional photoresists. The removal and/or degradation of photoresists makes the formation of circuits impossible.

Another method for etching polyimide involves potassium hydroxide. There are, however, three significant problems commonly associated with etching polyimide in potassium hydroxide. The first problem is long etch time. The long etch time results because most etching processes which use potassium hydroxide are relatively slow. The second problem associated with etching polyimide is poor sidewall definition. Poor sidewall definition is also referred to as poor etch factor. Finally, the third problem associated with etching polyimide in potassium hydroxide is the low loading factor of potassium hydroxide. That is, the etchability of potassium hydroxide decreases upon repeated or extended exposure to polyimide as a result of potassium hydroxide's limited capacity for polyimide residue.

In response to some of the difficulties, several methods were developed to address problems associated with etching polyimide from a substrate. For example, U.S. Pat. No. 3,791,848 to DeAngelo relates to an etching composition and a method utilizing such a composition for etching a surface of a polyimide. The method comprises exposing the polyimide surface to an etching composition comprising an aqueous solution of a basic compound and ethylenediamine. In particular, the ethylenediamine synergistically increases the etching rate of the polyimide.

U.S. Pat. No. 4,960,491 to Youlton relates to a process for etching a polymeric material by reaction with either an acid or alkaline etching solution. A reactive material, such as aluminum metal, is added to the etching solution in order to generate nascent hydrogen which promotes the etching process by increasing the etching rate and dispersion of the etch residue.

U.S. Pat. No. 4,846,929 to Bard et al relates to a process for etching fully cured or substantially fully cured polyimide which comprises contacting the polyimide layer with an aqueous solution of metal hydroxide followed by contact with an acid, followed by contact with a metal hydroxide solution. Etching of chemically cured polyimide can be enhanced by employing a pre-soaking in hot water.

U.S. Pat. No. 4,426,253 to Kreuz et al relates to etching the surface of polyimide material by the use of an aqueous solution of either ethyl or propyl alcohol, or a combination of ethyl and propyl alcohol, containing a basic compound. The aqueous solution contains 45 to 98% by weight of an alcohol selected from the group consisting of ethanol, n-propanol, isopropanol or a combination of these alcohols.

SUMMARY OF THE INVENTION

The present invention relates to methods of etching polyimide from a substrate and to the etched substrates prepared according to such methods. In one embodiment, the present invention provides a method of etching polyimide from a substrate, comprising the steps of:

A) providing a basic bath;
B) ultrasonically agitating said basic bath;
C) exposing said substrate containing polyimide to said basic bath;
D) rinsing said substrate with hot water;
E) optionally repeating the aforementioned steps at least once; and
F) recovering an etched substrate.

In another embodiment, the present invention provides a method of etching polyimide from a substrate, comprising the steps of:

A) providing a basic bath;
B) exposing said substrate containing polyimide to said basic bath;
C) rinsing said substrate with hot water;
D) optionally repeating the aforementioned steps at least once;
E) maintaining a high loading capacity for said basic bath after exposure of said polyimide to said basic bath, comprising cooling at least a portion of said basic bath thereby forming a precipitate and separating said precipitate from said basic bath prior to reuse of said basic bath; and
F) recovering an etched substrate.

In a preferred embodiment, the present invention provides a method of etching a polyimide from a substrate, comprising the steps of:

A) providing a basic bath;
B) ultrasonically agitating said basic bath;
C) exposing said substrate containing polyimide to said basic bath;
D) rinsing said substrate with hot water;
E) optionally repeating the aforementioned steps at least once;
F) maintaining high loading capacity for said basic bath after exposure of the polyimide to said basic bath, comprising cooling at least a portion of said basic bath thereby forming a precipitate and separating said precipitate from said basic bath prior to reuse of said basic bath; and
G) recovering an etched substrate.

In another embodiment of the present invention, maintaining the etchability of the basic bath may be carried out in a continuous fashion. In yet another embodiment, the resultant etched substrate prepared according to the methods of the present invention may provide a hybrid circuit, a printed circuit board or a tape automated bonding structure.

These and other aspects of the invention will become clear to those skilled in the art upon the reading and understanding of the specification.

BRIEF DESCRIPTION OF THE DRAWING

The invention will be further described in connection with the attached drawing figure showing preferred embodiments of the invention including specific parts and arrangements of parts. It is intended that the drawing included as a part of this specification be illustrative of a preferred embodiment of the invention and should in no way be considered as a limitation on the scope of the invention.

DETAILED DESCRIPTION OF THE INVENTION

Figure 1:
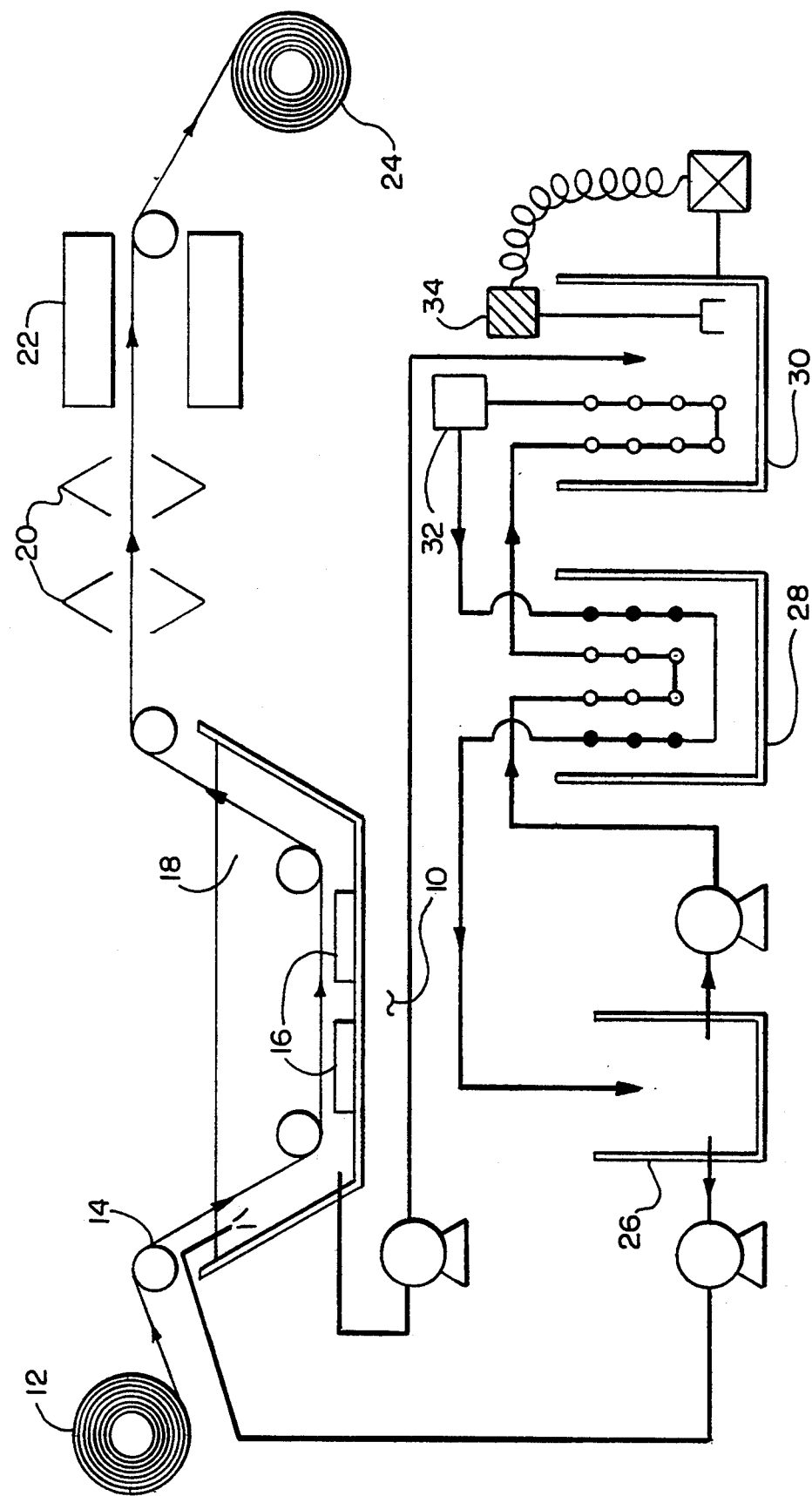
FIG. 1 is a schematic drawing showing the relationship of the various parts of a preferred embodiment of a continuous etching system according to the present invention.

Novel methods of etching polyimide from a substrate have been discovered as well as the etched substrates prepared according to such methods which overcome problems of the methods presently used in the industry and discussed above. The method of the present invention may result in substantially all of the polyimide being removed, or only discrete portions of the polyimide substrate being removed. For example, a substrate may contain a photoresist layer which protects certain portions of the polyimide. Application of the methods disclosed herein to that particular substrate yields an etched substrate characterized by an absence of unprotected polyimide.

A large variety of substrates containing polyimide are applicable within the scope of the invention. For example, the substrates containing polyimide according to the present invention may contain one or more metal components. Without being so limited, examples of such metal components are: chromium, cobalt, copper, nickel, tungsten, vanadium, molybdenum, titanium, zirconium, niobium, tantalum, ruthenium, platinum, palladium, silver, scandium, gold, yttrium, cerium, thorium, and combinations thereof.

The substrates of the present invention may also contain photoresists. Specific photoresists which may be contained on a substrate of the present invention include KFTR negative photoresists, RISTON ® sold by E. I. du Pont de Nemours and Company, and Laminar Brand solvent based resist type UF, sold by Dynachem (a division of Morton Thiokol).

The substrates of the present invention may also contain various organic materials. Organic materials which may be present in the substrate of the present invention are: epoxy resins, polyol resins such as PKHC ® by Union Carbide Corporation, EpiREZ ® SU-8 and EpiREZ ® 5183 by High Tek Polymers, Inc.

The substrates may further contain photoimagable material, sensitizers, paints, lacquers, inks, adhesives and the like. Other materials known to those skilled in the art may also be present. In general, the non-polyimide materials present within or associated with a substrate according to the present invention are substantially unaffected by the methods described herein.

The methods of etching polyimide from a substrate may be used to etch virtually any polyimide used in the modern electronics industry. Examples of the polyimides which may be etched in accordance with the present invention include unmodified polyimides, and modified polyimides such as polyester imides, polyimide-imide-esters, polyamide-imides, polysiloxane-imides, as well as other mixed polyimides. In a preferred embodiment of the present invention, the polyimide to be etched is a maleimide derivative. A more preferred polyimide is commercially available from DuPont under the trade designation Kapton ®. Examples of Kapton ® polyimides available include H-Kapton ®, V-Kapton ®, HN-Kapton ® and VN-Kapton ®.

The basic bath of the present invention is an aqueous solution which contains a basic compound. The aqueous solution containing a basic compound has a pH of at least about 8.0. Preferably, the pH of the aqueous solution containing a basic compound is at least about 12, and most preferably a pH of greater than 14. In one embodiment of the present invention, the basic bath is an aqueous solution which comprises a metal hydroxide. In a preferred embodiment, the basic bath contains an alkali metal hydroxide. Specifically, sodium hydroxide and potassium hydroxide are preferred basic compounds contained in the basic bath. The concentration of the basic compound in the basic bath is determined by the speed and the desired degree of etching in a particular application of the methods of the present invention. For instance, in one embodiment, the concentration of the basic compound in the basic bath is from about 10 to about 12 normal. In a preferred embodiment, the concentration of the basic compound in the basic bath is about 11 normal. Furthermore, the basic bath is maintained at an elevated temperature. Generally, the basic bath is maintained at a temperature above about 150° F. In a preferred embodiment, the temperature of the basic bath is from about 200° F. to about 230° F.

Referring now to the drawing, FIG. 1 illustrates generally a system for the continuous etching of a polyimide according to a preferred embodiment of the present invention comprising etching tank 10 containing ultrasonic units 16 immersed in etching bath 18 and positioned at the bottom of tank 10. The polyimide material 14 to be etched may be in the form of a roll 12 of metal foil laminated onto a polyimide substrate and further containing a photoresist as shown or alternatively the system may have conveying means, e.g., metal screen, in which to advance the polyimide containing component or material 14 through the bath 18. Alternatively, copper may be vapor deposited on the polyimide substrate to form the desired circuit. Ultrasonic units 16 agitate bath 18 during etching to increase the etch rate. The etched polyimide material 14 is advanced out of tank 10 to hot water rinse 20, through dryers 22 and taken up onto roll 24. A portion of the etching bath 18 which comprises KOH is continuously pumped to cooling tank 30 comprising thermocouple 34. The cooled portion of the bath is filtered through filter 32. The filtered etching solution is preheated in preheating tank 28, returned to sump 26 where −OH ion concentration is monitored and maintained at between about 10.8N and 11.2N. The filtered etching solution is then returned to etching tank 10. By the continuous removal of a portion of the etching bath 18 and cooling of the solution to approximately 100° F. to about 140° F. to cause the precipitation of particulate followed by the filtering of the precipitate from the cooled etching solution, a high loading etching solution may be maintained having etch rates of 1 mil/min. or greater.

Further in accordance with the methods of the present invention, ultrasonic agitation is applied to the basic bath. In particular, the ultrasonic agitation is applied while the substrate containing polyimide is exposed to the basic bath. The ultrasonic agitation may be applied by one or more ultrasonic generators. The generator(s) may comprise any suitable ultrasonic generator known in the art. For example, a suitable generator may comprise an electromechanical transducer for converting electrical energy into mechanical vibrations in the ultrasonic frequency range. An appropriate electrical circuit may be provided for energizing each transducer. The ultrasonic generator(s) may be positioned in any suitable location in order to apply adequate agitation to the basic bath. The application of ultrasonic agitation increases the etch rate of the substrate.

According to the present invention, the substrate containing polyimide is exposed to the basic bath as the basic bath is ultrasonically agitated. The polyimide surface of the substrate is exposed, that is, comes in contact with the basic bath in any manner effective to allow etching. In one embodiment, the substrate may be immersed in the basic bath. Any other methods of exposure known to those skilled in the art may be employed. In a continuous fashion, the substrate may be attached to a rack, metal screen or conveyor belt, or similar type of apparatus, which moves through the bath followed by the hot water rinse.

After the substrate containing polyimide is exposed to the basic bath, it is rinsed with hot water. The water used to rinse the substrate may contain small amounts of additional substances or impurities. In a preferred embodiment of the present invention, the water is pure water. Also in accordance with the present invention, it should be noted that the water used to rinse the substrate is hot water. In one embodiment, the temperature of the hot water is above about 165° F.

Optionally, certain steps disclosed in the methods of the present invention may be repeated. In particular, repeating certain steps of the methods may significantly reduce, in some cases, the time to etch polyimide from a substrate. The steps which may be repeated include: ultrasonically agitating said basic bath; exposing said substrate containing polyimide to said basic bath, and rinsing said substrate with hot water. For instance, in one embodiment of the invention a double pass sequential process is employed which improves the quality of the etched substrate recovered. A sequential or repetitive process may, in some instances, improve the sidewall definition and decrease the etch time. The certain steps to be repeated are repeated at least once.

Further in accordance with the present invention, the etchability or loading of the basic bath is maintained. Etchability or high loading of the bath, as used herein, indicates that the basic bath is capable of etching polyimide. It also indicates that the basic bath has not become saturated with polyimide residue which prevents the basic bath from further etching polyimide. After exposure of the substrate containing polyimide to the basic bath, the etchability is maintained by cooling, that is, lowering the temperature of at least a portion of the basic bath. In one embodiment, discrete amounts or portions of the basic bath are cooled. In another embodiment, the entire basic bath is cooled. Cooling the basic bath, or portions thereof after exposure to polyimide, causes precipitation of contaminate particulate from the basic bath. Thereafter, the particulate or precipitate is separated from the basic bath using separating means. In one embodiment, the separation is carried out using a filter. After the separation, the portion of basic bath which was cooled is reheated and returned to the basic bath, step (a) of the method described herein. Once returned to the basic bath, etching may continue.

As stated above, at least a portion of the basic bath is cooled which causes particles to precipitate from the bath. The temperature of the portion of basic bath after cooling must be lower than the temperature of the basic bath as described in step (a) of the method of the present invention. Generally, the portion of basic bath is cooled to a temperature which is sufficiently low enough to cause precipitation of particles. In one embodiment, a portion of the basic bath is cooled to a temperature below about 140° F. In a preferred embodiment, a portion of the basic bath is cooled to a temperature below about 120° F.

Without intending to be so limited, it is believed that the particles, which precipitate out of the cooled portion of the basic bath, are polyimide residue products. The residue includes polyimide, base degraded polyimide and any other products related thereto. It should be kept in mind, however, that it is important that the precipitate be separated from the portion of the basic bath which is cooled.

The methods of the present invention may be conducted in three different fashions. Specifically, the methods according to the present invention may be carried out using a continuous, intermittent, or batchwise system. In a continuous system, the basic bath is recycled. That is, portions of the basic bath solution are continuously removed from the basic bath followed by cooling the portions removed, separating the precipitate, and continuously returning the separated portions back into the basic bath. The rate of the continuous flow may be adjusted according to the unique characteristics of an individual system. In an intermittent system, a similar process is carried out wherein the continuous flow is interrupted. A batch-wise system involves cooling the entire basic bath, followed by separating the precipitate, followed by reuse of the basic bath. In all three situations, the basic bath, or portions thereof are cooled to effect precipitation of particles and the particles are separated from the basic bath for reuse of the basic bath. One difference in the three systems is the amount of basic bath used for the etching process.

The etchability of the basic bath is related to the loading factor, or loading capacity. The loading factor, expressed by the area of material etched per volume of etchant, is an indicator of the amount of material which may be etched by a discrete amount of basic bath. In other words, once the etchant becomes saturated with the material to be etched and the resulting degradative by-products, the ability of the etchant to etch no longer exists. Therefore, a high loading factor or capacity indicates the ability of an etchant to etch a large amount of material. The basic bath, when recycled according to this invention, maintains a high loading factor or capacity. Because the etchability of the basic bath is maintained, the basic bath of the present invention does not reach the saturation threshold with regard to polyimide. For instance, a basic bath comprising 11N potassium hydroxide possesses a loading factor of approximately 3 square inches of 2 mil thick Kapton ® per gallon of the basic bath. However, the application of the methods of the present invention prevents the basic bath from reaching its loading factor and, in effect, permits the basic bath to be indefinitely used.

Further in accordance with the methods of the present invention, an etched substrate is recovered (after rinsing the substrate with hot water). The etched substrate is characterized by the absence of exposed polyimide as compared to the substrate containing polyimide prior to processing in accordance with the present invention. Generally, non-polyimide components of the substrate are unaffected by the methods used in the present invention. The etched substrate recovered may be a hybrid circuit, a printed circuit board or a tape automated bonding structure.

In addition to the high rate of etching, the etched substrates prepared according to the methods of the present invention exhibit improved sidewalls. Sidewall definition relates to the perpendicularity of the sidewall (usually of the material to be etched) relative to the plane of the substance below the material to be etched. A related phenomenon is undercut. For example, a substrate containing Kapton ® with a developed photoresist pattern thereon may be etched. The unprotected Kapton ® is removed while the Kapton ® under the photoresist remains on the substrate. However, it is not unusual for the Kapton ® in close proximity to the photoresist to be removed in greater quantities as compared to the Kapton ® in close proximity to the substance below the Kapton ®. Thus, the sidewall of Kapton ® is not substantially perpendicular relative to the substance below the Kapton ®. Another term which synonymously relates to sidewall definition is etch factor. Etch factor, well known in the electronic circuitry art, is a measure of the degree of etching taking place laterally within the polyimide material relative to the degree of etching taking place in a direction perpendicular to the surface of the polyimide material. The etched substrates prepared according to the methods of the present invention exhibit good etch factor.

The following examples will serve to further illustrate the operation and advantages of the invention. These examples should not be considered, however, as a limitation upon the scope of the present invention where such scope is defined only by the claims.

EXAMPLE 1

A sample of 2 mil Kapton ® polyimide film (E.I. du Pont de Nemours and Company) containing copper foil is subjected to a continuous etching at 10 IPM to about 12 IPM and at a temperature of about 200° F. to about 230° F. The bath −OH ion concentration is monitored and maintained at 10.8N to about 11.2N KOH. The components were rinsed at rinse water stations having a temperature of 165° F. to about 180° F. Portions of the bath were continuously removed from the etch tank and cooled to approximately 120° F. with subsequent filtering of the bath through a 1 micron filter. This cycle was repeated. The resultant components were completely etched of Kapton ®.

EXAMPLE 2

A piece of Kapton ® film, not a component as in Example 1, was introduced to the continuous etching process of Example 1. The temperature of the bath was 230° F. and the film was advanced through the etching bath at a rate of 18 IPM. Portions of the bath were continuously cooled at a temperature of approximately 120° F. and the cooled portion filtered. The Kapton ® was completely etched in the process at a rate of approximately 1 mil/min.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

We claim:
1. A method of etching polyimide from a substrate, comprising the steps of:
    (a) providing a basic bath;
    (b) exposing said substrate containing polyimide to said basic bath;
    (c) rinsing said substrate with hot water;
    (d) maintaining a high loading capacity for said basic bath after exposure of polyimide to said basic bath, comprising cooling at least a portion of said basic bath thereby forming a precipitate and separating said precipitate from said basic bath prior to reuse of said portion of said basic bath returning said portion of said basic bath to said basic bath to maintain the high loading capacity of said basic bath; and
    (e) recovering an etched substrate.
2. The method of claim 1 wherein steps (b) and (c) are repeated at least once.
3. The method of claim 1 wherein step (d) is continuous.
4. The method of claim 1 wherein said basic bath is at a temperature from about 200° F. to about 230° F.
5. The method of claim 1 wherein said basic bath comprises an alkali metal hydroxide.
6. The method of claim 5 wherein the alkali metal hydroxide in said basic bath is at a concentration from about 10 to about 12 normal.
7. The method of claim 5 wherein the alkali metal is potassium.
8. The method of claim 1 wherein the portion of said basic bath in step (e) is cooled to a temperature below about 140° F.
9. The method of claim 1 wherein the portion of said basic bath in step (e) is cooled to a temperature below about 120° F.
10. The method of claim 1 wherein the particles are separated from said basic bath with a filter.
11. The method of claim 1 wherein said hot water in step (c) is at a temperature above about 165° F.
12. The method of claim 1 wherein the etched substrate of step (e) is a hybrid circuit.
13. The method of claim 1 wherein the etched substrate of step (e) is a printed circuit board.
14. The method of claim 1 wherein the etched substrate of step (e) is a tape automated bonding structure.
15. The method of claim 1 wherein said basic bath is ultrasonically agitated.

* * * * *